April 30, 1968 W. L. SCHALLIOL 3,381,081
ELECTRICAL CONNECTION AND METHOD OF MAKING THE SAME
Filed April 16, 1965 2 Sheets-Sheet 1
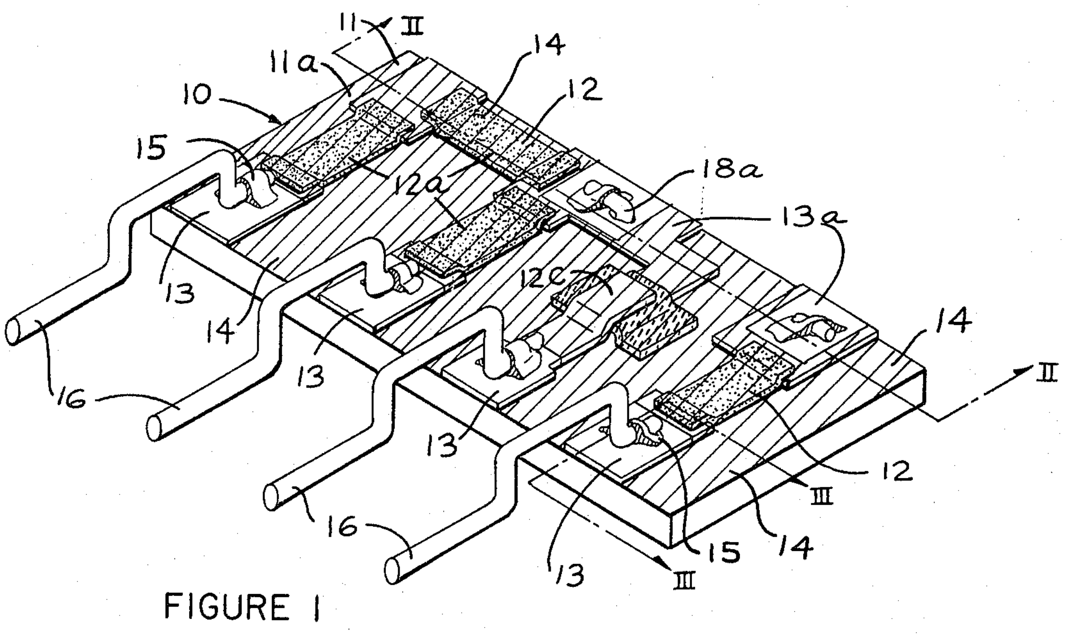
FIGURE I
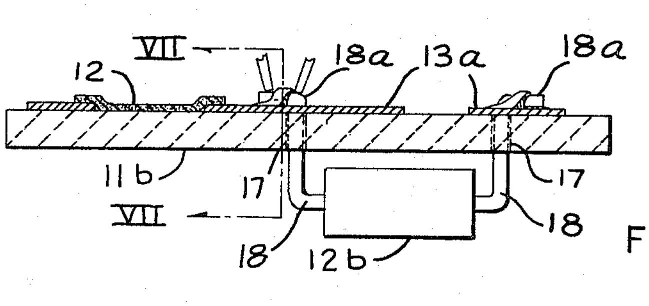
FIGURE 2
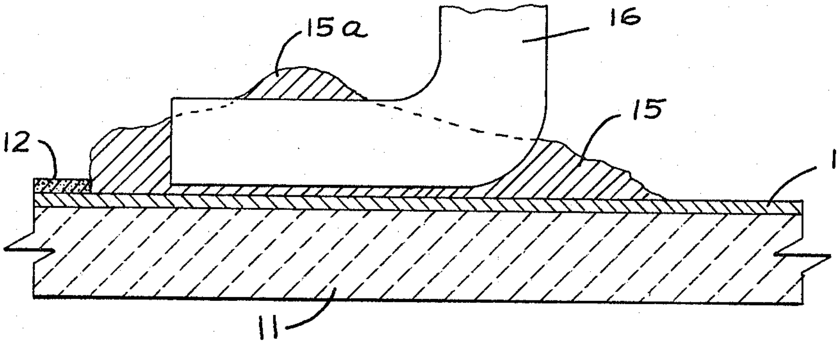
FIGURE 3
INVENTOR
WILLIS L. SCHALLIOL
BY John J. Gaydos
ATTORNEY INVENTOR
WILLIS L. SCHALLIOL
BY John J. Gaydos
ATTORNEY

United States Patent Office 3,381,081
Patented Apr. 30, 1968

3,381,081

ELECTRICAL CONNECTION AND METHOD OF MAKING THE SAME

Willis L. Schalliol, Lafayette, Ind., assignor to CTS Corporation, Elkhart, Ind., a corporation of Indiana Filed Apr. 16, 1965, Ser. No. 448,754
14 Claims. (Cl. 174—68.5)

ABSTRACT OF THE DISCLOSURE

An electrical connection and a method of making the same for connecting a conductor to a conductive land bonded to a substrate and connected to an electrical device supported on a surface of the substrate. The conductor preferably provided with a footed lead is initially tacked to a layer of tack solder bonded to the conductive land and then a fillet of solder having a melting temperature lower than the tack solder is bonded to the layer of tack solder and to the portion of the conductor anchored to the tack solder. The conductor can pass through an opening provided in the substrate when the electrical device is on or spaced from the other surface of the substrate. Spaced electrodes can be employed for melting the tack solder which can be in the form of preformed chip.

The present invention relates to electrical components, and, more particularly, to a termination of a miniature electrical component having an improved electrical connection and to a method of making the same.

The invention is particularly applicable to a metallized, foil type, or electrically conductive land or termination for an electrical device suported on a substrate of electrically nonconductive material. Electrical connections for such electrical components generally employ a soldered or welded joint for securing a conductor to an electrical device. These joints, however, are not completely satisfactory as the size of the electrical components decrease beyond certain dimensions. The relatively soft material, especially the thin and soft surface of a conductively coated land supported on a substrate, does not provide sufficient body for welding a conductor thereto. A common soldered connection, on the other hand, because of the low melting temperature of the solder may not render sufficient mechanical strength desirable and, in certain applications, necessary for connecting a conductor to an electrical component.

Accordingly, it is an object of the present invention to provide an improved electrical connection for a miniature electrical component.

Another object of the present invention is to provide an improved electrical connection for a small electrical device supported on a substrate of electrically nonconductive material.

An additional object of the present invention is to provide an improved method of joining metal parts together with a firm strong joint wherein one of the metal parts has a relatively soft, yieldable surface.

A further object of the present invention is to provide an electrical component with a connection employing a hard tack solder for securing a conductor to an electrically conductive land and a soft solder covering the hard tack solder and to a method of making such connection.

Still another object of the present invention is to provide a more reliable connection for an electrical component in a simple and facile manner.

Still an additional object of the present invention is to provide a miniature electrical component with a connection having an increased either longitudinal, or transverse, pull strength.

A still further object of the present invention is to provide an electrical component with an improved connection impervious to extraneous conditions, physical shocks, impacts, vibrations, humidity and the like.

Yet another object of the present invention is to provide a method for rapidly making soldered electrical connections for miniature electrical components with an electric gap welder.

Yet a further object of the present invention is to provide a method for rapidly making soldered electrical connections for miniature electrical components with an electric gap welder by holding the conductor under pressure against a conductive land with a pair of spaced electrodes and discharging a controlled amount of electrical energy through the portion of the conductor between the electrodes to melt the solder and hold the conductor in the molten solder until it solidifies.

Further objects and advantages of the present invention will become apparent as the following description proceeds, and the features of novelty characterizing the invention will be pointed out with particularity in the claims annexed to and forming a part of this specification.

In general, the present invention is concerned with an improved connection for a miniature electrical component. The electrical component comprises a substrate of electrically nonconductive material having supported thereon a plurality of electrical devices connected to electrically conductive lands bonded to a surface of the substrate. A layer of high-melting-temperature tack solder is bonded to each of the conductive lands and a portion of a conductor is anchored to the layer of tack solder preferably with an electric gap welder for positioning and anchoring the conductor to the tack solder. Preferably, after the tack solder has solidified, a fiillet of low-temperature solder is bonded to the layer of tack solder and to the anchored portion of the conductor for increasing the strength of the electrical connection.

For a better understanding of the present invention, reference may be had to the accompanying drawings wherein the same reference numerals have been applied to like parts and wherein:

FIGURE 1 is an enlarged isometric view of an electrical component provided with an electrical connection made in accord with the present invention;

FIGURE 2 is a section taken along line II—II of FIGURE 1;

FIGURE 3 is a grossly enlarged fragmentary section taken along line III—III of FIGURE 1;

Figures 4, 5:
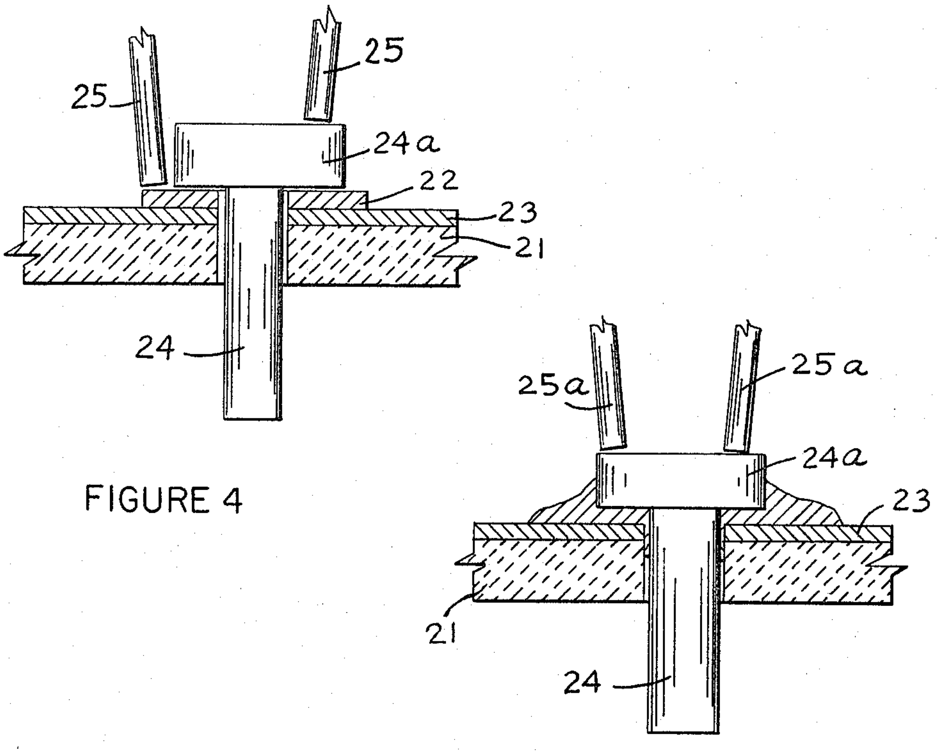
FIGURES 4 and 5 show another embodiment of the invention before and after the soldering operation.

Referring now particularly to the accompanying drawings, there is illustrated an electrical component, generally indicated at 10, comprising a substrate 11 having a top surface **11*a*. The substrate 11** can be part of a panel adapted to have a plurality of printed circuits applied thereto, but in the present case is illustrated simply as a rectangular slab of suitable electrically nonconductive material, preferably a ceramic dielectric material, such as alumina or steatite.

Bonded or secured onto the top surface **11*a* of the substrate 11 are a plurality of thin film passive and discrete active electrical devices 12, e.g., vacuum deposited metal or glass-metal matrix resistance elements 12*a*, diode and/or transistor 12*b* and thin film capacitor 12*c*. Also bonded onto the top surface 11*a* of the substrate 11 are a plurality of conductive lands 13, each land having a portion thereof in overlapping relationship with one of the electrical devices 12. As shown in FIGURE 1 of the drawings, the conductive lands 13 are bonded onto the top surface of the substrate prior to the resistance elements 12***a* in order that the resistance elements can be monitored at various stages of production.

The conductive lands 13 generally comprise a commercially available gold, platinum or silver paste deposited on the top surface 11*a* of the substrate by painting, screening or the like. Other metal particles besides gold, platinum and silver can be employed in preparing the paste, however, the above metal particles are preferred since these metals do not readily oxidize and are excellent electrical conductors. The conductive lands are either air dried or fired in a kiln at elevated temperatures depending upon the vehicles employed in preparing the paste. When desired, a metallized conductive land can be deposited on the top surface 11*a* of the substrate by vacuum deposition or the like. Similar well known procedures are followed in depositing the electrical devices 12 except discrete active devices on the top surface 11*a* of the substrate. For example, if glass-metal matrix thin film resistance elements are employed, then the substrate 11 with the conductive lands 13 and the resistance elements deposited on the top surface 11*a* thereof is fired above the softening temperature of the glass particles of the matrix but below that of the metal particles of the matrix to drive off the organic vehicles and fuse the glass particles together and to the substrate. After the resistance elements 12*a* and the conductve lands 13 are bonded to the substrate, the top surface of the substrate is coated with a suitable material 14 such as a layer of glass or organic coating material to protect the electrical devices 12 from atmospheric and other environmental conditions. Suitable masks are provided to prevent the coating material 14 from covering portions of the conductive lands 13.

In accord with one form of the present invention and as best shown in FIGURE 3 of the drawings, the substrate 11 is dipped into a molten high-melting-temperature tack solder, hereinafter referred to as a hard solder, for depositing a thin layer 15 of hard solder on each of the uncoated portions of the conductive lands 13. After the layers of hard solder have solidified on the conductive lands 13, the substrate 11 can be placed in a suitable fixture for supporting a plurality of conductors 16 with portions thereof in contact with the layers of hard solder. For small production quantities, tweezers or the like can be employed for supporting the conductors on the thin layers 15 of the hard solder during the soldering operation for securing the conductors to the lands. Preferably and in accord with the present invention, a parallel gap welder is employed for supporting and tacking the conductors 16 to the layers of hard solder. It has been found that a gap welder provided with a pair of closely spaced electrodes not only quickly melts the layer 15 of hard solder and forces a portion of the conductor into the hard solder but also holds under proper pressure the conductor 16 against the conductive land 13 until the hard solder has solidified.

The thickness of the layer 15 of hard solder controls to a degree the strength of the bond and depends upon the type of conductor to be secured by the hard solder to the conductive land 13. For example, whenever the conductor 16 is a lead wire, the thickness of the layer 15 of hard solder should be at least one half and preferably equal to or greater than the thickness of the lead wire to obtain a strong bond, assuming that the thickness of the lead wire is substantially equal to the width thereof, and cause a bridge portion 15*a* of the hard solder to flow over the lead wire 16. The bridge portion forms readily only if the solder and wire are carefully cleaned. The use of a flux assists when careful cleaning is not practicable. The flowing of the bridge portion 15*a* of the hard solder over a portion of the lead wire apparently is due to puddling of the hard solder as it melts and wetting of the lead wire. Undoubtedly the strength of the soldered connection can be increased by increasing the thickness of the layer 15 of hard solder substantially, i.e., a thickness equal or greater than the thickness of the lead wire 16. The increased thickness of the layer 15, however, increases the heat sink and, consequently, additional power is necessary to melt the hard solder.

Whenever an active electrical device 12*b* such as a diode or a transistor is secured to the conductive lands 13*a* deposited on the surface 11*a* of the substrate 11 it is preferable to provide through holes 17 in the conductive lands 13*a* and the substrate 11 and mount the active device 12*b* on the bottom surface 11*b* of the substrate with the conductors 18 extending through the holes 17, the end portions 18*a* of the conductors 18 being tacked to the conductive lands 13*a* in the same manner as the conductors 16 (see FIGURE 2). The placement of the electrical devices on opposite sides of the substrate assures optimum use of the substrate. To improve the heat dissipation factor of the active device 12*b*, an air space is generally provided between the bottom surface 11*b* of the substrate and the active device 12*b*.

In another form of the present invention, as shown in FIGURE 4 of the drawings, if it is not desired to immerse the substrate 21 into a molten hard solder, a preformed chip 22 of hard solder can be positioned on or superimposed over a conductive land 23 and, after the substrate 21 is placed in a suitable fixture, a conductor 24 having an enlarged head 24*a* is positioned on, or adjacent to, the preformed chip 22 of hard solder. Heating of the preformed chip 22 of hard solder and the conductor 24, e.g., with a not shown gap welder, the electrodes 25 being shown in FIGURE 4 of the drawings, melts the preformed chip 22 of hard solder and causes the hard solder to wet the conductive land 23 as shown in FIGURE 5. The electrodes 25 of the gap welder are stepped for causing the current to flow directly through the preformed chip 22 of hard solder and the head 24*a* of the conductor 24. The left electrode can contact the conductive land 23 if the conductive land 23 if the preformed chip 22 is of insufficient diameter. A gap welder having parallel electrodes 25*a*, as shown in FIGURE 5, can also be employed, the only difference being that the preformed chip 22 of hard solder is heated indirectly since the current flows only through the head 24*a* of the conductor 24. It is to be understood that either type of electrode arrangement can be used for melting the layer 15 or chip 22 of hard solder. Similarly, the hard solder can be applied to the conductor such as by dipping the conductor in the hard solder, and the solder-coated conductor can be secured to the conductive land with a gap welder. After the hard solder solidifies, the conductor is firmly anchored to the conductive land by means of the hard solder.

Generally the thicknesses of the various elements forming a miniature electrical component are as follows.

| Element: | Thickness in inches |
|---|---|
| Substrate | .010–.030 |
| Conductive land | .001–.002 |
| Hard solder | |
| (a) Layer | .005–.015 |
| (b) Chip | .003–.010 |
| Soft solder | .002–.010 |
| Conductor | .001 min. |
| (a) Lead wire | .001–.020 |

Figure 6:
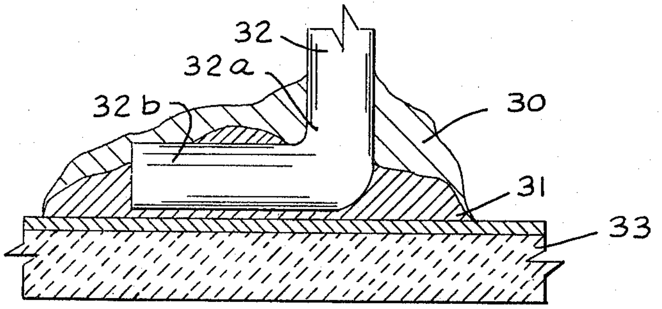
FIGURE 6 is a fragmentary section similar to FIGURE 3 showing still another embodiment of the present invention.

As readily ascertainable from the above limits, if the maximum available thickness of the layer 15 obtainable by dipping of the substrate into a molten hard solder is .015 inch and the thickness or diameter of the conductor is in excess of .015 inch, it is difficult to provide a layer 15 of hard solder having a thicknes of approximately the thickness of the conductor 16 unless the conductor is precoated or a preformed chip is employed. When such conditions are encountered, it is preferable to employ an additional layer of solder for securing the conductor to the conductive land. To this end, a fillet 30 (see FIGURE 6) of low-melting-temperature solder, hereinafter referred to as a soft solder, is deposited and bonded to the outer surface of the layer 31 of hard solder and the portion 32a of the conductor 32. The fillet 30 of soft solder can be applied over the hard solder by dipping the substrate 33 into molten soft solder, by melting soft solder wire with a soldering iron, or preformed chips of soft solder may be properly positioned and melted by suitable means. Preferably the thickness of the fillet 30 of soft solder is 1 to 2 times as great as the layer 31 of hard solder. By employing a hard solder for tacking the conductor to the conductive land, the conductor is not in any manner repositioned while the soft solder is being applied to the hard solder thereby increasing the lateral and transverse strength of the connection.

If a preferred form of the invention, when the conductor 32 is a lead wire, the end thereof is provided with a lateral end portion 32b, commonly referred to as a footed end portion. When the diameter of the lead wire exceeds certain dimensions, a fillet 30 of soft solder is preferably bonded to the layer 31 of hard solder. Such construction increases the pull strength of the lead wire or connection since any lateral or transverse stress is uniformly distributed over the entire bonding area between the layer of hard solder, the conductive land and the substrate.

Several examples of solder employable in the practice of the present invention are as follows:

HARD SOLDER

| Composition | Melting Range | |
|---|---|---|
| | Solidus, ° C. | Liquidus, ° C. |
| 1.5% Tin, 97% Lead, 1.5% Silver | [1] 310 | 310 |
| 5% Tin, 95% Lead | 272 | 314 |
| 10% Tin, 90% Lead | 224 | 302 |

SOFT SOLDER

| Composition | Solidus, ° C. | Liquidus, ° C. |
|---|---|---|
| 63% Tin, 37% Lead | [1] 183 | 183 |
| 60% Tin, 40% Lead | 183 | 188 |
| 50% Tin, 50% Lead | 183 | 212 |

[1] Eutetic.

Figures 7A, 7B:
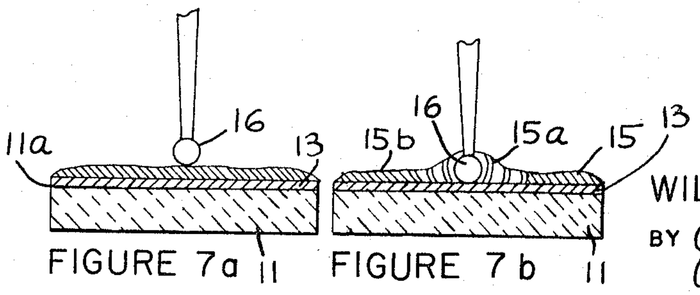
FIGURES 7*a* and 7*b* are fragmentary sectional views taken along line VII—VII of FIGURE 2 before and after the weld soldering operation, assuming that FIGURE 2 is shown in full.

In order that the method of practicing the present invention with the electric gap welder will readily be understood, it is preferable that the layer 15 of hard solder or soft solder if not detrimental to proper performance of the electrical components (see FIGURE 7a of the drawings) be deposited on the conductive land 13 bonded to the top surface 11a of the substrate. The conductor 16 is then positioned on the layer 15 of solder and held under pressure thereagainst with a pair of spaced electrodes of a not-shown electric gap welder. A controlled amount or charge of electrical energy is then rapidly discharged through the portion of the conductor between the electrodes for rapidly melting the layer 15 of solder. Preferably the charge of electrical energy is of such quality, i.e., contains a limited number of thermal units, that only a small puddle 15a of molten solder surrounding the conductor as shown in FIGURE 7b of the drawing is melted. As soon as the puddle 15a of solder is formed, the conductor sinks into and is embedded in the molten solder, but because of the pressure of the spaced electrodes against the conductor, the conductor is held in position until the puddle of molten solder solidifies. The rapid discharge of electrical energy into the portion of the conductor assures that the heat or thermal units generated by the discharge are of a minimum amount to maintain the puddle of solder surrounding the conductor as small as possible to avoid thermal degradation to the electrical components. Care must be taken with active devices to confine any electrical flow in the lead itself and none must be permitted to flow thru the device or electrical damage might occur. Moreover, the unmelted portion 15b of the layer of solder surrounding the puddle 15a of molten solder rapidly absorbs the thermal units from the puddle of molten solder thereby reducing the hold time of the spaced electrodes after the discharge of the electrical energy. Thus rapid positioning of the conductor 16 on the layer of solder and weld solder of the conductor 16 to the conductive land is accomplished. Preferably the layer 15 of solder is applied to the conductive land 13 by dipping the substrate into molten solder.

While there has been illustrated and described what is at present considered to be a preferred embodiment of the present invention and a method of making the same and several modifications thereof, it will be appreciated that numerous changes and modifications are likely to occur to those skilled in the art, and it is intended in the appended claims to cover all those changes and modifications which fall within the true spirit and scope of the present invention.

I claim:

1. An article of manufacture comprising an electrically nonconductive substrate supporting an electrical device, a conductive land bonded to one of the surfaces of the substrate, a portion of the conductive land being electrically connected to the electrical device, a layer of tack solder bonded to the conductive land, a conductor having a portion thereof anchored to the layer of tack solder, and a fillet of solder having a softening temperature range lower than the tack solder bonded to the layer of tack solder and to the portion of the conductor anchored to the tack solder.

2. A connection for an electrical component, comprising a substrate of electrically nonconductive material, a conductive land supported by the substrate, a tack solder bonded to the conductive land, a conductor tacked to the solder, and a fillet of solder having a softening temperature range lower than the tack solder further securing the conductor to the tack solder for increasing the pull strength therebetween.

3. The connection of claim 2, wherein the tack solder comprises a composition having a melting temperature range of 224 to 314 degrees centigrade and the fillet of solder comprises a composition having a melting temperature range from 183 to 212 degrees centigrade.

4. The connection of claim 2, wherein the portion of the conductor tacked to the tack solder and embedded in the fillet of solder is a footed end portion.

5. In an electrical component, the combination of a substrate of electrically nonconductive material, a plurality of thin film electrical devices bonded to a first surface of a substrate, a plurality of conductive lands bonded to the first surface of the substrate and connected to the thin film electrical devices in overlapping relationship, the substrate being provided with a pair of through holes communicating with a pair of the conductive lands, an active device disposed adjacent to a second surface of the substrate, a pair of conductros extending through the holes and connecting the active device to the pair of conductive lands, a layer of tack solder bonding each of the conductors to the conductive lands, and a fillet of solder having a softening temperature range lower than the tack solder covering each of the layers of tack solder and at least a portion of each of the conductors adjacent to the conductive lands for increasing the pull strength therebetween.

6. A method of connecting a conductor to a conductive land of an electrical component having an electrical device supported on a substrate of electrically nonconductive material comprising the steps of: dipping the substrate into molten solder to coat the conductive land with tack solder, tacking the conductor to the tack solder by melting the tack solder, and dipping the substrate with the tacked conductor into a molten solder having a softening temperature range lower than the tack solder to cover the tack solder and the tacked portion of the conductor for increasing the pull strength between the conductor and the conductive land.

7. A method of connecting a conductor to a conductive land of an electrical component having an electrical device supported on a substrate comprising the steps of: masking the conductive land on the substrate, coating the substrate with an electrically nonconductive material, dipping the coated substrate into a molten tack solder for covering the conductive land with a layer of the tack solder, tacking the conductor to the solder covered portion of the conductive land with an electric gap welder, and covering a portion of the conductor and the layer of the tack solder with a cover solder having a lower-melting-temperature range than the tack solder.

8. The method of claim 7, comprising the additional steps of: forming a footed leg on the conductor before tacking the conductor to the solder covered portion of the conductive land.

9. A method according to claim 7, wherein the tack solder is of a composition having a melting temperature range from 224 to 314° C. and wherein the cover solder is of a composition having a melting temperature range from 183 to 212 degrees in centigrades.

10. A method of connecting a conductor to a conductive land of an electrical component comprising the steps of: depositing a preformed chip of tack solder on the conductive land, positioning a conductor on the preformed chip, melting the preformed chip to bond the conductor to the conductive land, and covering the portion of the conductor bonded to the conductive land and the tack solder with a fillet of solder having a softening temperature range lower than the tack solder.

11. A method of securing a miniature electrically conductive lead to a conductive body comprising the steps of: depositing a layer of solder on the conductive body, positioning the conductive lead on the layer of solder, holding the conductive lead against the layer of solder with a pair of spaced electrodes, rapidly discharging a controlled amount of electrical energy through the portion of the conductive lead between the pair of spaced electrodes, melting only a portion of the layer of solder adjacent to the conductive lead, and holding the conductive lead in the molten solder with the pair of spaced electrodes until the solder has solidified.

12. A method of securing a miniature electrically conductive lead to a conductive body comprising the steps of: depositing a layer of solder on the conductive body, holding under pressure the conductive lead against the layer of solder with a pair of spaced electrodes, rapidly discharging a controlled amount of electrical energy through the portion of the conductive lead between the pair of spaced electrodes, forming a puddle in only a portion of the layer of solder adjacent to the conductive lead, and holding the conductive lead in the puddle of solder with the pair of spaced electrodes until the solder has solidified.

13. A method of securing a miniature electrically conductive lead to a conductive body comprising the steps of: depositing a body of solder on the conductive body, holding the conductive lead against the body of solder with a pair of spaced electrodes, resistance heating the portion of the conductive lead between the pair of spaced electrodes, forming a puddle in only a portion of the body of solder adjacent to the conductive lead, and holding the conductive lead in the puddle of solder with the pair of spaced electrodes until the solder has solidified.

14. The method of claim 13, including the step of forming a bridge of solder over the conductive lead between the pair of spaced electrodes.

References Cited

UNITED STATES PATENTS

| | | | |
|---|---|---|---|
| 3,303,393 | 2/1967 | Humes et al. | |
| 3,079,482 | 2/1963 | Gutbier | 219—85 X |
| 3,102,213 | 8/1963 | Bedson et al. | 174—68.5 |
| 3,207,838 | 9/1965 | McCormack | 174—68.5 |
| 3,283,119 | 11/1966 | Hromadka | 219—85 |

FOREIGN PATENTS

| | | |
|---|---|---|
| 937,711 | 6/1963 | Great Britain. |

DARRELL L. CLAY, *Primary Examiner.*